United States Patent [19]
Paulos et al.

[11] Patent Number: 5,594,442
[45] Date of Patent: Jan. 14, 1997

[54] CONFIGURATION PROGRAMMING OF A DIGITAL AUDIO SERIAL PORT USING NO ADDITIONAL PINS

[75] Inventors: John J. Paulos; Gautham D. Kamath; Andrew W. Krone, all of Austin, Tex.

[73] Assignee: Crystal Semiconductor Corporation, Austin, Tex.

[21] Appl. No.: 212,978

[22] Filed: Mar. 15, 1994

[51] Int. Cl.⁶ .................................................. H03M 6/66
[52] U.S. Cl. .......................................................... 341/143
[58] Field of Search .................................. 341/143, 144, 341/155; 375/371, 373

[56] References Cited

U.S. PATENT DOCUMENTS 5,436,943  7/1995  Borgen ..................................... 375/371

Primary Examiner—Brian K. Young
Attorney, Agent, or Firm—Robert D. Lott

[57] ABSTRACT

A stereo digital-to-analog converter is able to operate in an 8 pin package yet to operate under a variety of serial data input formats. The normal de-emphasis pin can be used for receiving a static de-emphasis signal, an external serial clock, or programming data for the serial data formats. In addition metal and wire bond options are used to provide more flexibility in the manufacturing process.

34 Claims, 5 Drawing Sheets

5,594,442

CONFIGURATION PROGRAMMING OF A DIGITAL AUDIO SERIAL PORT USING NO ADDITIONAL PINS

REFERENCE TO RELATED APPLICATION

Reference is made to a related application entitled AUTOMATIC REFERENCE VOLTAGE SCALING IN ANALOG-TO-DIGITAL AND DIGITAL-TO-ANALOG CONVERTERS, Ser. No. 08/212,977, filed Mar. 15, 1994 in the name of Paulos, John J. and Dupuie, Scott T. and which is hereby incorporated by reference. This application describes and claims a method for adjusting one or more internal reference voltages which is used in the preferred embodiment of the present invention.

BACKGROUND OF THE INVENTION

Analog-to-digital and digital-to-analog converters designed for digital audio applications frequently support a three-wire, serial interface for stereo (two channel) digital audio data. A typical timing diagram for a serial interface is shown in FIG. 1. This interface consists of a serial data stream (SDATA), a serial clock (SCLK), and a frame clock or left/right clock (LRCK). In an analog-to-digital converter, the serial data (SDATA) is generated by the part, and the serial data clock (SCLK) may be generated by the part or by a separate part. In a digital-to-analog converter, the serial data (SDATA) and serial clock (SCLK) are provided by the user. In both cases, the user is typically required to provide the left/right clock (LRCK), and in many converters the user must also provide a master clock (MCLK) at an integer multiple of the LRCK frequency. The serial data stream contains data for both left and right channels in an interleaved format. When LRCK is high, a sample of the left channel signal is presented, and when LRCK is low, a sample of the right channel signal is presented. The frequency of the LRCK clock is therefore equal to the sampling rate (Fs) of the left and right channel PCM (Pulse Code Modulation) data. The serial clock frequency is typically an integer multiple of the left/right clock, such as 32x or 64x Fs. The master clock is typically at a rate of 256x, 384x, or 512x Fs.

While this three-wire serial interface is widely used, there is a multiplicity of data formats which are in common use. The potential variations in serial data format can be summarized as follows:

1. the sense of the LRCK (left channel during LRCK high or left channel during LRCK low), 2. whether data is presented MSB (Most Significant Bit) first or LSB (Least Significant Bit) first, 3. whether the data is left justified or right justified relative to the LRCK transitions, 4. the number of data bits per channel, typically 16, 18, or 20, 5. the number of SCLK cycles which are expected during one LRCK period, 6. the edge of the SCLK which defines when the serial data is latched, 7. whether the first data bit is delayed one SCLK period after the leading LRCK edge, or not.

Many commercial parts are able to operate with more than one of these competing serial data formats in order to provide a higher degree of system compatibility. When a multiplicity of serial formats are supported, the user is required to select the desired format either by programming the part by hard wiring external pins, or by using an available programming port. In either case, these programming means require additional pins on the integrated circuit. In applications where physical space is important, such as portable compact disk (CD) players or in-dash automotive systems, a minimum pin-count is desired to minimize the printed circuit board (PCB) space required by the integrated circuit.

It can therefore be appreciated that a method which allows flexibility of an integrated circuit while keeping the pin-count to a minimum is highly desirable.

SUMMARY OF THE INVENTION

It is therefore an object of the present invention to provide a method which allows flexibility of an integrated circuit while keeping the pin-count to a minimum.

Shown in an illustrated embodiment of the invention is a data conversion device which has a three-wire serial interface comprising a serial data terminal, a serial data clock terminal, and a left/right clock interface. At least one pin of the data conversion device is able to receive and differentiate between one or more of a plurality of input functions.

In a further aspect on the invention the data conversion device uses wire bond options to select the default for the serial data format.

BRIEF DESCRIPTION OF THE DRAWINGS

The aforementioned and other features, characteristics, advantages, and the invention in general, will be better understood from the following, more detailed description taken in conjunction with the accompanying drawings in which.

Figure 1:
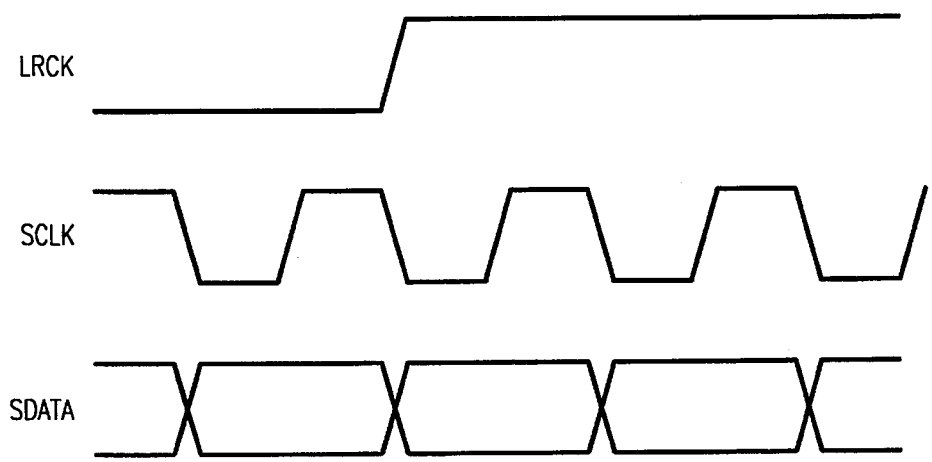
FIG. 1 is a timing diagram of a three-wire serial interface.

It will be appreciated that for purposes of clarity and where deemed appropriate reference numerals have been repeated in the figures to indicate corresponding features.

DESCRIPTION OF THE PREFERRED EMBODIMENT

The preferred embodiment of the present invention uses a collection of methods by which a digital audio serial port can be configured without introducing additional pins. These methods may be used individually or in combination. These methods are summarized below.

1. Elimination of the Serial Clock

Figure 2:
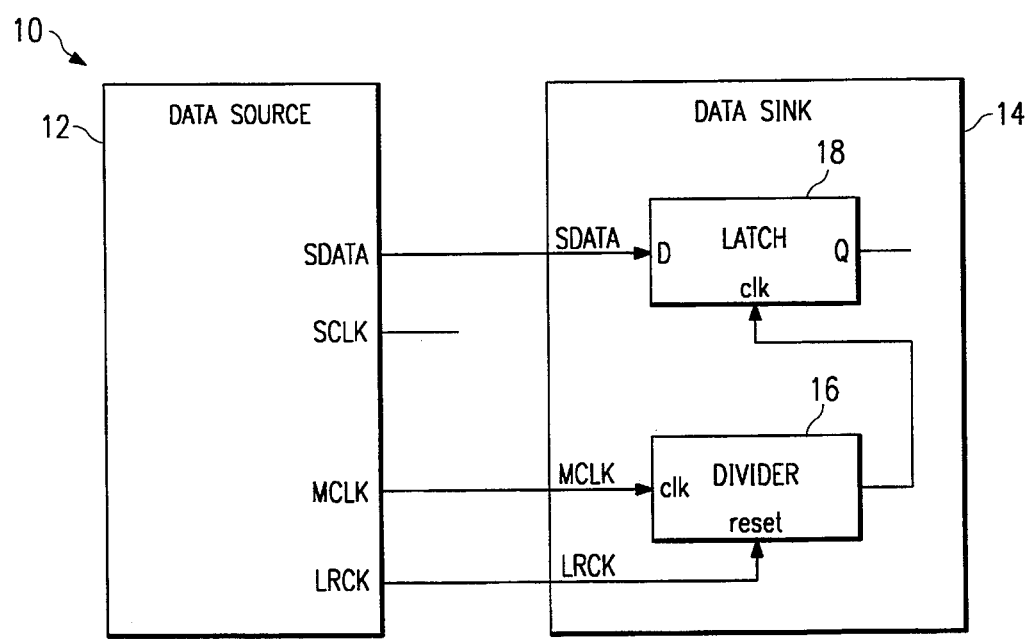
FIG. 2 is a block diagram of a three-wire serial interface between two data conversion devices showing use of one aspect of the present invention.

In many cases, both the SCLK and the LRCK are synchronously derived from a common master clock (MCLK) which is available at both the data source and the data sink. As a result, the frequency and relative timing of the SCLK to the LRCK is precisely known, and the physical distribution of the SCLK is really not required as the receiver can locally recreate the SCLK timing for the purpose of latching the serial data. A block diagram of a system 10 for communicating between two data conversion devices using this technique in shown in FIG. 2. A data source 12, such as a dual channel analog-to-digital converter, provides signals of SDATA, MCLK, and LRCK to a data sink 14, such as a dual channel digital-to-analog converter and described in more detail below. In the data sink 14, the MCLK signal is divided down by a divider circuit 16 which is periodically reset by the LRCK signal. The output of the divider 16 is used to latch in the SDATA using the D latch 18. The output of the D latch 18 is therefore the resynchronized serial data. In this case, the pin previously used as the SCLK input can instead be used as a programming pin for the purpose of configuring the part for the desired serial data format. With this approach, it is desirable that the serial interface be configurable for a multiplicity of (internally generated) SCLK rates.

2. Dual Use of the Serial Clock Pin

In most cases, an analog-to-digital or digital-to-analog converter goes through a power-up sequence prior to beginning normal operation. This power-up sequence typically includes a long delay to allow the voltage reference to settle and may include a calibration cycle. During this time, the digital audio data present at the serial interface is ignored. Therefore, it is possible to use the SCLK pin as a programming pin for the purpose of configuring the data format to be used by the serial interface, prior to the application of an external serial clock. If the protocol for the programming function is very slow relative to an ordinary SCLK, it is possible to automatically discriminate between a programming command and an ordinary SCLK. For example, the programming function can utilize a multi-bit data sequence which is clocked at the LRCK rate, with at most one data transition per LRCK period. Using this protocol, a simple counter can discriminate between a programming command and a true SCLK.

3. Dual Use of a Non-Interface Pin

Rather than providing programming of the serial interface via dual use of the SCLK pin, it is possible to support programming via dual use of some other pin. For example, many digital-to-analog converters for digital audio applications include a de-emphasis filter which is controlled by a DEEMPHASIS pin. In normal use, the DE-EMPHASIS signal is essentially static. The de-emphasis filter may be selected for a given compact disk, or a given track on a compact disk, but the DE-EMPHASIS signal will never rapidly toggle back and forth. The programming protocol described above, where data bits are clocked at the LRCK rate, can be combined with the de-emphasis select function on a single pin. If the programming protocol includes a leading data pattern of '010' every programming command will include a rapid toggle of the dual use DEM/SCLK/CONFIG pin. When this leading data pattern is detected, the trailing data can be interpreted as programming data. However, if a fixed sequence of '1' or '0' data is presented, this data can be interpreted as the de-emphasis setting.

4. Configuration Via Bond Options

A final means of providing some level of personalization of the serial interface is to utilize bond options. A single die can be designed with extra pads such that the connectivity of the extra pads to the package pins defines the desired serial interface configuration. Using this method, the serial interface format is fixed at the time the part is packaged, and can not be reconfigured at a later time. Nevertheless, a single circuit design can be manufactured, up to the packaging step, to cover a variety of interface formats. This method can be combined with the programming methods described above if the bond option is used only to fix the default serial interface format.

Figure 3:
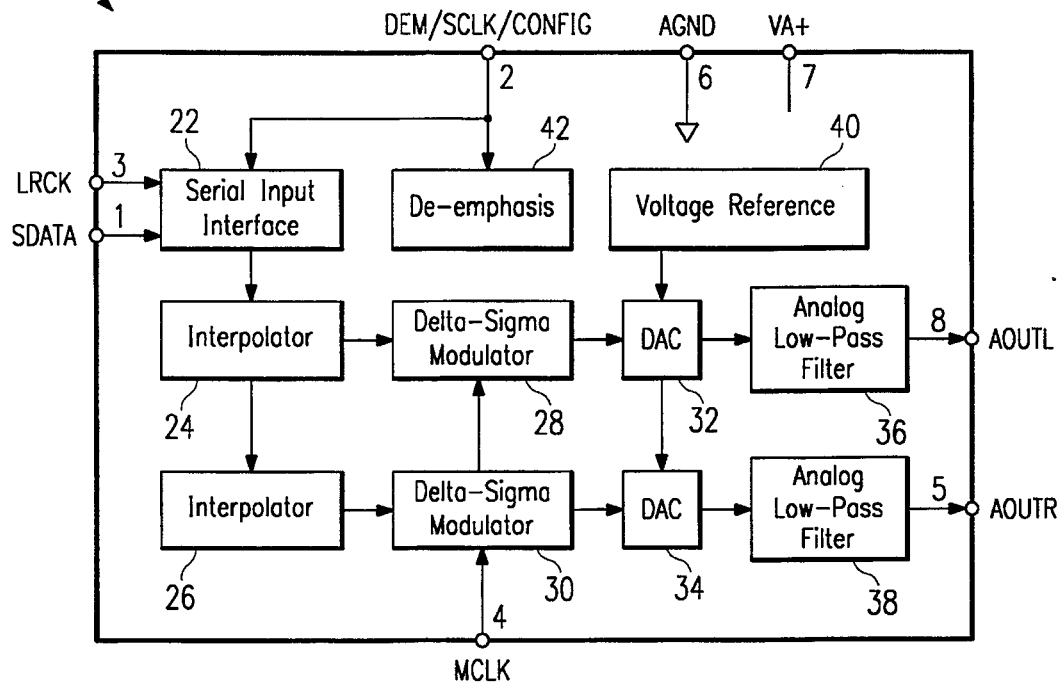
FIG. 3 is a block diagram of a digital-to-analog data conversion device which incorporates the present invention.

The preferred embodiment of the invention is a low cost, stereo digital-to-analog converter intended for digital audio applications. A block diagram 20 for this part is shown in FIG. 3, including pin assignments for an 8-pin package. The part provides two channels of digital-to-analog conversion with either 16 or 18-bit input data. The part includes a serial interface 22 for stereo input data, two interpolation filters 24 and 26, two digital delta-sigma modulators 28 and 30 which produce 1-bit data streams for two 1-bit digital-to-analog converters (DACs) 32 and 34, two analog low-pass filters 36 and 38 which use switched-capacitor techniques, and an on-chip voltage reference 40. A de-emphasis circuit 42 receives a de-emphasis signal. The interpolation filters 24 and 26 are switchable, and can produce either a flat response or a de-emphasis response as required for Compact Disk (CD) applications. The part is designed to operate from a multiplicity of master clock frequencies (256x, 384x, and 512x times the digital audio sampling rate), and can support a multiplicity of serial data formats. The digital-to-analog converter 20 operates from a single supply voltage VA+ between 2.7 V and 5.5 V.

Several steps have been taken in the digital-to-analog converter to achieve the maximum flexibility with a limited number of pins. Specifically, all four of the pin-saving techniques described above have been used in combination to support programming of a multiplicity of serial data formats with no additional pins. The lowest possible pin count for a stereo digital-to-analog converter using the conventional three-wire serial interface is 8; V+, V−(or GND), AOUTL, AOUTR, MCLK, SCLK, LRCK, and SDATAI. This pin assignment would ordinarily preclude the use of a pin to engage, or disengage, the de-emphasis filter. Moreover, this pin assignment does not provide pins for setting the serial data format. As indicated in FIG. 3, Pin 2 of the new digital-to-analog converter IC (Integrated Circuit) is used to provide all three functions. If the user needs to signal de-emphasis filter changes, Pin 2 can be used as a static de-emphasis control (DEM), in which case the part will automatically generate an internal serial clock. If the user needs to provide an external serial clock, for example in a system where the serial data is not synchronous with the MCLK, Pin 2 can be used as a serial clock input (SCLK), and the de-emphasis switching is automatically disabled. In either case, if the user needs to operate the part with a serial data format other than the default format, Pin 2 can be presented with an 8-bit configuration sequence (CONFIG). This configuration capability is available from power-up until the user presents an external serial clock. In an application where the internal serial clock is used, the configuration use of Pin 2 is available at any time. Finally, three part types will be produced which differ only in their default serial data formats. These three part types are realized using a single design with bond options. Two pads for the LRCK are provided on the integrated circuit, and the default serial data format is programmed by which, or both, of these pads are physically connected (bonded) to the package pins. Each of these features is described separately below.

1. Elimination of Serial Clock

Figure 4:
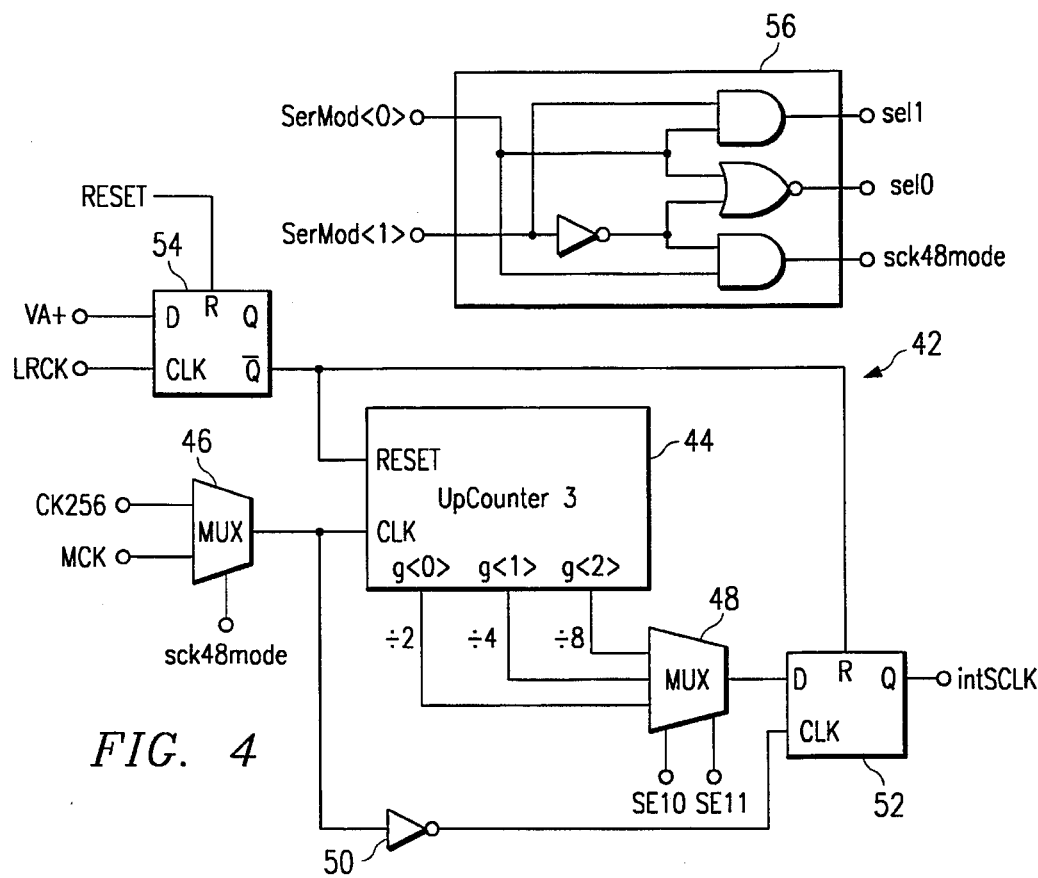
FIG. 4 is a logic diagram of circuitry used to generate an internal serial clock in the data conversion device shown in FIG. 3.

The part operates with an internal 256Fs master clock, which can be derived from either a 512Fs, 384Fs, or 256Fs external master clock. FIG. 4 is a logic diagram of circuitry used to generate an internal serial clock in the data conversion device shown in FIG. 3. The internal serial clock generator 42 divides down the internal 256Fs master clock (ck256) to produce 32Fs, 64Fs, or 128Fs serial clocks. This is done by a 3-bit synchronous up-counter 44 which is cleared to all zeros and which starts counting at a rising left-right clock (LRCK) edge. A 48Fs internal serial clock can also be generated if the external master clock is 384Fs. In this case, the external master clock (MCK) is presented to the 3-bit counter through a multiplexor (MUX) circuit 46 instead of the ck256 clock. One of the three outputs of the counter 44 is passed through another multiplexor 48. The serial clock generated at the output of the multiplexor 48 is shifted by one phase by the operation of the inverter 50 and the D latch 52 of whichever of MCK or ck256 was chosen to produce the clock. This approximately places the rising serial clock edge within half a clock period of its ideal location in the middle of the data slot. A D latch 54 is used to reset the counter and D latch 52 on the rising edge of the LRCK signal. The control signals for this block are decoded in a control circuit 56. Two of the serial data formatting bits, SerMod<1:0> are inputs to the control circuit 56, where values of 00 and 01 indicate settings of 128Fs and 64Fs respectively. A value of 10 indicates a setting of 32Fs or 48Fs depending on the sck48mode signal. The convention <1:0> indicates two data bits having bit positions 0 and 1. The SerMod<0> and SerMod<1> (which can also be shown as SerMod<1:0>) bits are processed by the well known logic circuitry shown in FIG. 4 to provide the sel1, sel0 and the sck48mode signals used in the internal serial clock generator 42

2. Dual use of the Serial Clock Pin

Figure 5:
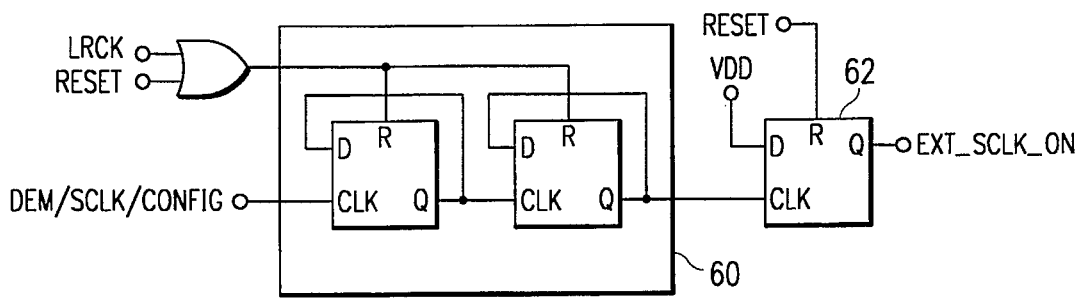
FIG. 5 is a logic diagram of a circuit used to detect the presence of an external clock signal applied to the data conversion device shown in FIG. 3.

In the preferred embodiment an internal serial clock is always generated and used until an external serial clock is detected on Pin 2. An external serial clock is indicated by at least 4 positive transitions of the signal from Pin 2 (DEM/SCLK/CONFIG) during LRCK low. This is detected using a 2-bit up counter 60, as shown in FIG. 5. Once an external serial clock is detected, EXT_SCLK_ON is set and will not change until the part is reset by the action of the D latch 62.

Figure 6:
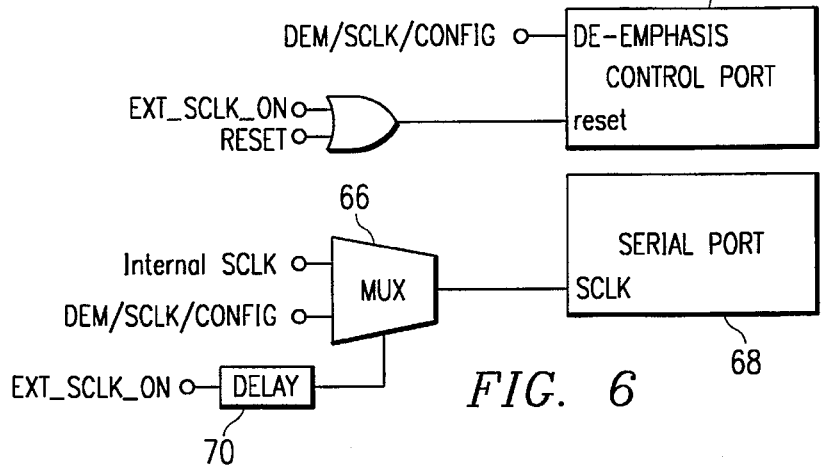
FIG. 6 is a block diagram showing how the output of the detection circuit shown in FIG. 5 is used by a control port and a serial port in the data conversion device of FIG. 3.

As shown in FIG. 6 the EXT_SCLK_ON is used to prevent the control port 64 from recognizing the DEM/SCLK/CONFIG signal as a control port command or de-emphasis change by holding the control port 64 in reset. EXT_SCLK_ON also selects, using the multiplexor 66, between the internally generated SCLK and DEM/SCLK/CONFIG as the clk input to the serial port 68. The EXT_SCLK_ON signal is delayed by a delay circuit 70 so that the internal SCLK will control the serial port 68 until the start of a new LRCK data frame.

3. Dual Use of a Non-Interface Pin

Figure 8:
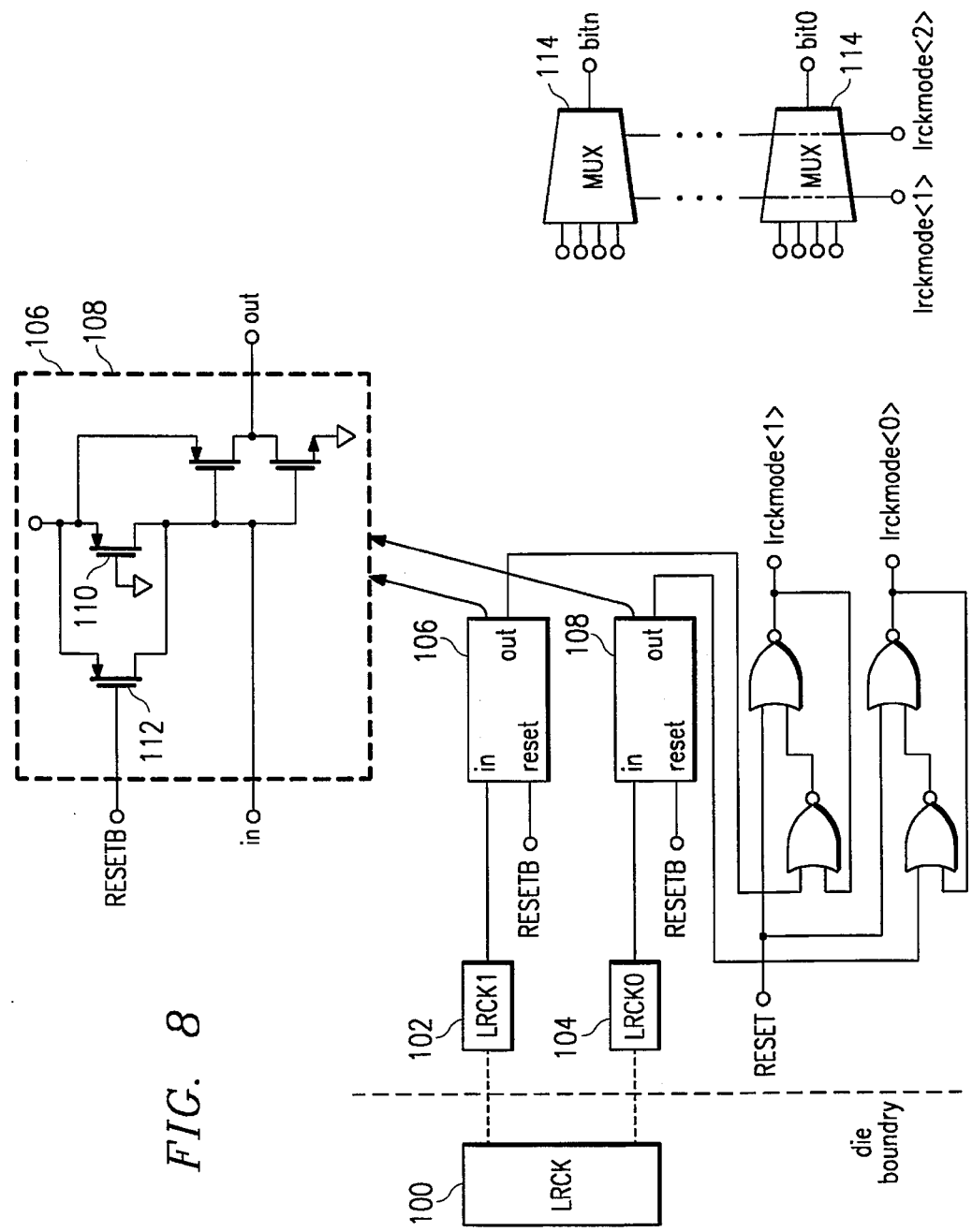
FIG. 8 is a partial logic, partial schematic diagram showing how a wiring bond option is embodied in the data conversion device of FIG. 3.

A block diagram 80 of the Control Port 64 as it relates to the dual use of the DEM/SCLK/CONFIG pin is shown in FIG. 8. A state machine 82, the design of which is well known in the art, initially sets the de-emphasis value seen by the digital filter, demph out, to '0'. On a '01' transition of DEM/SCLK/CONFIG, the next six values of DEM/SCLK/CONFIG are shifted in to a shift register 84 on each falling LRCK edge. The six count is accomplished by a down counter 86 which is preloaded with a six count by the signal 1d count, and which is then counted down using the $\overline{LRCK}$ (the inverse of LRCK) clock until a zero count is reached when the signal "zero" goes high. If all six bits, d<5:0>, are '1' the data is not interpreted as a control port command. Instead, the de-emphasis filter setting, demph out, is set to '1'. But, if a valid control port command is recognized, the six bits are examined by the circuitry shown in the block 88 to see if they correspond to serial port settings or test mode settings, and the six bits are appropriately mapped and loaded into the appropriate register, dff_bank5 90 if a test mode command, parallelreg8 92 if a serial port setting. The coding is such that '000000' is not recognized as a valid command, so as to insure that a transient signal on DEM/SCLK/CONFIG is not misinterpreted as a '01' header When the state of demph_out is '1' and DEM/SCLK/CONFIG changes to '0' in order to turn the filter off, the state machine waits for another '0'. This is to make sure a '01' transition to signal another control port command is not intended. Then demph_out is set to '0'.

4. Configuration Via Bond Options

Turning now to FIG. 8, in the preferred embodiment the LRCK input pin 100 on the I.C. package can be optionally wire bonded to one of two pads 102 and 104 on the I.C. chip, or wire bonded to both pads 102 and 104. The pads 102 and 104 are connected to a buffer circuit 106 and 108, respectively. Both buffer circuits 106 and 108 have weak pull-up devices 110 which will force the pad to logic '1' if the pad is not connected. If a given pad is bonded out, the only side effect of the pull-up device is a small amount of leakage current. An additional, stronger pull-up device 112 enabled by RESETB (the inverse of RESET) is used to guarantee that an unbonded pad is pulled up to a 1 before the global RESET is de-asserted. When the global RESET is deasserted, lrckmode<0> (which was initialized to 0) goes high if LRCK0 pad 104 is at 0. This can only happen if LRCK0 pad 104 is bonded to the LRCK pin. The same is true for LRCK1 pad 102 and lrckmode<1>. The lrckmode bits control several multiplexors 114 which select between three alternative sets of default settings for the serial port. (The lrckmode code '00' is undefined and can not happen for a correctly functioning part.) The inputs to the multiplexors are metal-mask programmable connections to VA+ or GND as is well known in the art.

Figure 9:
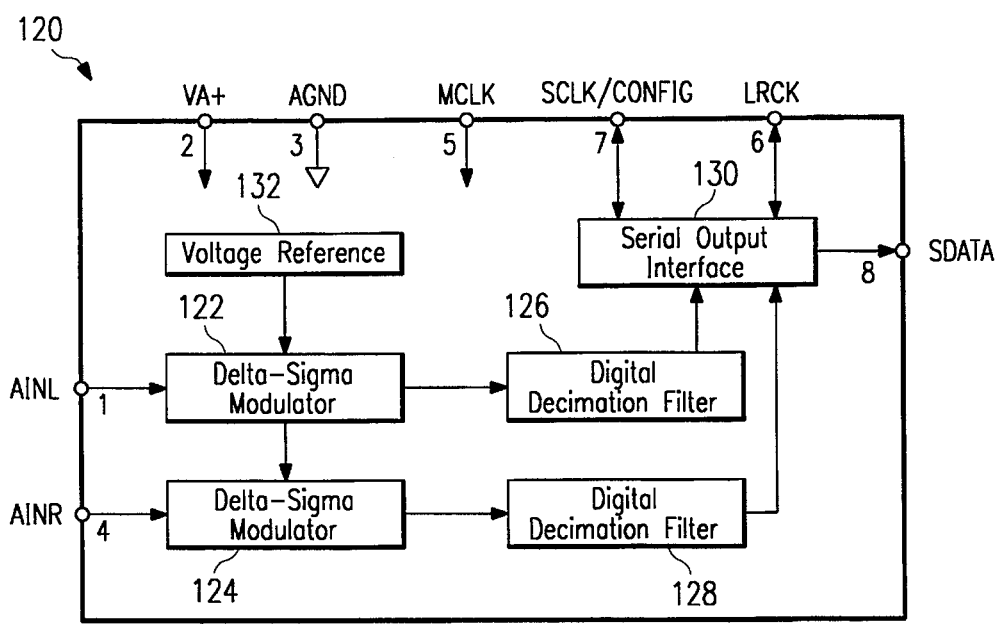
FIG. 9 is a block diagram of a analog-to-digital data conversion device which incorporates the present invention.

An alternative embodiment of the invention is a low cost, stereo analog-to-digital converter intended for digital audio applications. A block diagram 120 for this part is shown in FIG. 9, including pin assignments for an 8-pin package. The part provides two channels of analog-to-digital conversion with either 16 or 18-bit output data. The part includes two analog delta-sigma modulators 122 and 124 which produce 1-bit data streams for two decimation filters 126 and 128, a serial interface 130, and an on-chip voltage reference 132. This analog-to-digital part is similar to the digital-to-analog part shown in FIG. 3, and is designed to operate from a multiplicity of master clock frequencies (256x, 384x, and 512x times the digital audio sampling rate), and can support a multiplicity of serial data formats. The analog-to-digital converter 120 operates from a single supply voltage VA+ between 2.7 V and 5.5 V.

Figure 7:
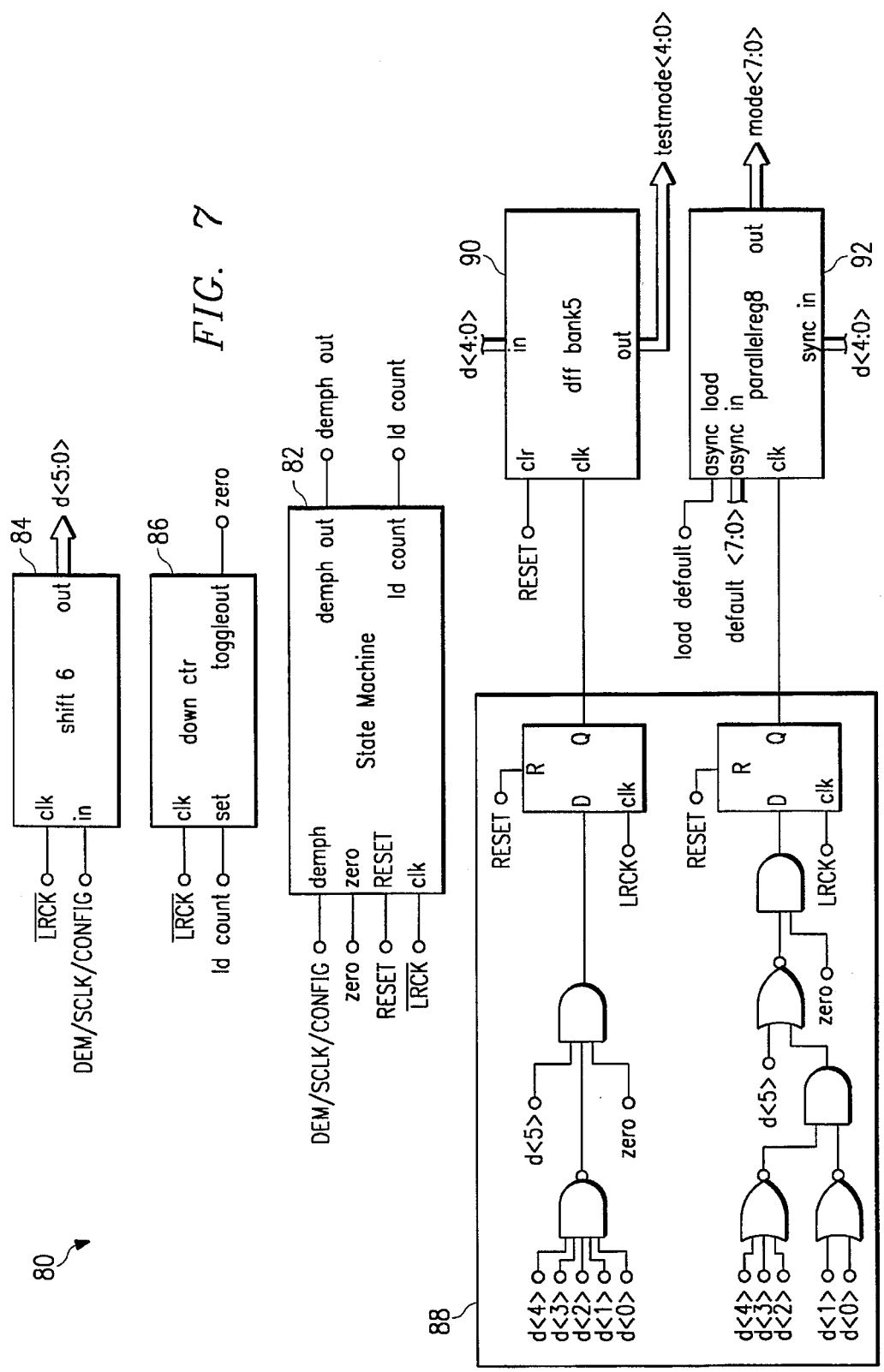
FIG. 7 is a partial block, partial logic diagram of the portion of the control port relating to two uses of the DEM/SCLK/CONFIG terminal of the data conversion device of FIG. 3.

The analog-to-digital converter 120 contains the circuitry shown in FIGS. 4–8 except that signal labeled DEM/SCLK/CONFIG in these drawings becomes SCLK/CONFIG, and the input labeled demph in the state machine 82 of FIG. 7 is not used, together with the output signal labeled demph out. With the absence of the demph function in block 82, the circuits shown in FIGS. 4–8 in the analog-to-digital converter 120 operate in the way described above.

Although the invention has been described in part by making detailed reference to a certain specific embodiment, such detail is intended to be, and will be understood to be, instructional rather than restrictive. It will be appreciated by those skilled in the art that many variations may be made on the structure and mode of operation without departing from the spirit and scope of the invention as disclosed in the teachings contained herein.

What is claimed is:

1. A delta-sigma digital-to-analog converter having a three-wire serial interface comprising a serial data terminal, a serial data clock terminal, and a left/right clock terminal, together with a pin for receiving a master clock signal, and providing left and right channels of analog signal, wherein said serial data clock can be generated inside said digital-to-analog converter by dividing said master clock signal, and wherein said serial data clock terminal is able to receive data for setting one or more of the functions selected from the group of serial data format, test mode, and de-emphasis selection.

2. A digital-to-analog converter having a three-wire serial interface comprising a serial data terminal, a serial data clock terminal, and a left/right clock terminal, the improvement comprising having at least one pin of said three-wire serial interface which is able to receive and differentiate between one or more of a plurality of functions.

3. The digital-to-analog converter set forth in claim 2 wherein said digital-to-analog converter receives an additional signal of a masterclock and wherein said serial data clock is generated inside said digital-to-analog converter by dividing said masterclock signal, and wherein said serial data clock terminal receives data for setting one or more of the functions selected from the group of serial data format, test mode, and de-emphasis selection.

4. The digital-to-analog converter set forth in claim 2 wherein said serial data clock terminal is able to receive and decode one of either serial data format information or test mode function information in the time interval between power up and normal operation, and an external serial data clock during normal operation.

5. The digital-to-analog converter set forth in claim 2 which includes an additional input terminal wherein said digital-to-analog converter recognizes a data sequence on said additional input terminal as one or more of the group consisting of programming data and test data, and recognizes a persistent logic level as data which is not programming data.

6. The digital-to-analog converter set forth in claim 2 wherein a wire bonding option is used to connect one of a plurality of bonding pads to an input terminal of said digital-to-analog converter, wherein each of said plurality of bonding pads provides different default serial data format.

7. The digital-to-analog converter set forth in claim 6 wherein at least one pin is able to receive and decode serial data format information which overrides said default serial data format.

8. The digital-to-analog converter set forth in claim 3 wherein said serial data format includes a predetermined preamble followed by a predetermined number of data bits, said predetermined preamble having at least one logic 0 to logic 1 transition and at least one logic 1 to logic 0 transition.

9. The digital-to-analog converter set forth in claim 8 wherein said serial data format is ignored by said digital-to-analog converter if said predetermined number of data bits are all of the same logic state such that the preamble bits plus the data bits contain only one logic 0 bit or only one logic 1 bit.

10. The digital-to-analog converter set forth in claim 9 wherein said preamble is a logic 010 sequence, and wherein said serial data is ignored by said digital-to-analog converter if said predetermined number of data bits are logic 0.

11. The digital-to-analog converter set forth in claim 4 wherein said serial data format includes a predetermined preamble followed by a predetermined number of data bits, said predetermined preamble having at least one logic 0 to logic 1 transition and at least one logic 1 to logic 0 transition.

12. The digital-to-analog converter set forth in claim 11 wherein said serial data format is ignored by said digital-to-analog converter if said predetermined number of data bits are all of the same logic state such that the preamble bits plus the data bits contain only one logic 0 bit or only one logic 1 bit.

13. The digital-to-analog converter set forth in claim 12 wherein said preamble is a logic 010 sequence, and wherein said serial data is ignored by said digital-to-analog converter if said predetermined number of data bits are logic 0.

14. The digital-to-analog converter set forth in claim 5 wherein said serial data format includes a predetermined preamble followed by a predetermined number of data bits, said predetermined preamble having at least one logic 0 to logic 1 transition and at least one logic 1 to logic 0 transition.

15. The digital-to-analog converter set forth in claim 14 wherein said serial data format is ignored by said digital-to-analog converter if said predetermined number of data bits are all of the same logic state such that the preamble bits plus the data bits contain only one logic 0 bit or only one logic 1 bit.

16. The digital-to-analog converter set forth in claim 15 wherein said preamble is a logic 010 sequence, and wherein said serial data is ignored by said digital-to-analog converter if said predetermined number of data bits are logic 0.

17. An analog-to-digital converter having a three-wire serial interface comprising a serial data terminal, a serial data clock terminal, and a left/right clock terminal, the improvement comprising having at least one pin of said three-wire serial interface which is able to receive and differentiate between one or more of a plurality of functions.

18. The analog-to-digital converter set forth in claim 17 wherein said analog-to-digital converter receives an additional signal of a masterclock and wherein said serial data clock is generated inside said analog-to-digital converter by dividing said masterclock signal, and wherein said serial data clock terminal receives data for setting one of the functions selected from the group of serial data format and test mode.

19. The analog-to-digital converter set forth in claim 17 wherein said serial data clock terminal is able to receive and decode one of either serial data format information or test mode function information in the time interval between power up and normal operation, and to transmit or receive a serial data clock during normal operation.

20. The analog-to-digital converter set forth in claim 17 which includes an additional input terminal wherein said analog-to-digital converter recognizes a data sequence on said additional input terminal as one or more of the group consisting of programming data and test data, and recognizes a persistent logic level as data which is not programming data.

21. The analog-to-digital converter set forth in claim 17 wherein a wire bonding option is used to connect one of a plurality of bonding pads to an input terminal of said analog-to-digital converter, wherein each of said plurality of bonding pads provides different default serial data format.

22. The analog-to-digital converter set forth in claim 21 wherein at least one pin is able to receive and decode serial data format information which overrides said default serial data format.

23. The analog-to-digital converter set forth in claim 18 wherein said serial data format includes a predetermined preamble followed by a predetermined number of data bits, said predetermined preamble having at least one logic 0 to logic 1 transition and at least one logic 1 to logic 0 transition.

24. The digital-to-analog converter set forth in claim 23 wherein said serial data format is ignored by said digital-to-analog converter if said predetermined number of data bits are all of the same logic state such that the preamble plus the data bits contain only one logic 0 or logic 1.

25. The analog-to-digital converter set forth in claim 24 wherein said preamble is a logic 010 sequence, and wherein said serial data is ignored by said analog-to-digital converter if said predetermined number of data bits are logic 0.

26. The analog-to-digital converter set forth in claim 19 wherein said serial data format includes a predetermined preamble followed by a predetermined number of data bits, said predetermined preamble having at least one logic 0 to logic 1 transition and at least one logic 1 to logic 0 transition.

27. The digital-to-analog converter set forth in claim 26 wherein said serial data format is ignored by said digital-to-analog converter if said predetermined number of data bits are all of the same logic state such that the preamble plus the data bits contain only one logic 0 or logic 1.

28. The analog-to-digital converter set forth in claim 27 wherein said preamble is a logic 010 sequence, and wherein said serial data is ignored by said analog-to-digital converter if said predetermined number of data bits are logic 0.

29. The analog-to-digital converter set forth in claim 20 wherein said serial data format includes a predetermined preamble followed by a predetermined number of data bits, said predetermined preamble having at least one logic 0 to logic 1 transition and at least one logic 1 to logic 0 transition.

30. The digital-to-analog converter set forth in claim 29 wherein said serial data format is ignored by said digital-to-analog converter if said predetermined number of data bits are all of the same logic state such that the preamble plus the data bits contain only one logic 0 or logic 1.

31. The analog-to-digital converter set forth in claim 30 wherein said preamble is a logic 010 sequence, and wherein said serial data is ignored by said analog-to-digital converter if said predetermined number of data bits are logic 0.

32. A delta-sigma analog-to-digital converter having a three-wire serial interface comprising a serial data terminal, a serial data clock terminal, and a left/right clock terminal, together with a pin for receiving a master clock signal, and providing left and right channels of analog signal, wherein said serial data clock can be generated inside said analog-to-digital converter by dividing said masterclock signal, and wherein said serial data clock terminal is able to receive data for setting one or more of the functions selected from the group of serial data format, test mode, and de-emphasis selection.

33. A data conversion device having a three-wire serial interface comprising a serial data terminal, a serial data clock terminal, and a left/right clock terminal, the improvement comprising having at least one pin of said three-wire serial interface which is able to receive and differentiate between one or more of a plurality of functions.

34. The data conversion device set forth in claim 33 wherein said data conversion device receives an additional signal of a masterclock and wherein said serial data clock is generated inside said data conversion device by dividing said masterclock signal, and wherein said serial data clock terminal receives data for setting the serial data format in said data conversion device.

* * * * *